United States Patent
Lindenstruth et al.

(10) Patent No.: US 9,476,605 B2
(45) Date of Patent: Oct. 25, 2016

(54) BUILDING FOR A COMPUTER CENTRE WITH DEVICES FOR EFFICIENT COOLING

(75) Inventors: Volker Lindenstruth, Mainz (DE); Horst Stöcker, Oberursel (DE)

(73) Assignee: e3 Computing GmbH, Mainz (DE)

( * ) Notice: Subject to any disclaimer, the term of this patent is extended or adjusted under 35 U.S.C. 154(b) by 551 days.

(21) Appl. No.: 13/001,947

(22) PCT Filed: Jun. 30, 2009

(86) PCT No.: PCT/EP2009/004704
§ 371 (c)(1),
(2), (4) Date: Jun. 1, 2011

(87) PCT Pub. No.: WO2010/000440
PCT Pub. Date: Jan. 7, 2010

(65) Prior Publication Data
US 2011/0220324 A1   Sep. 15, 2011

(30) Foreign Application Priority Data

Jun. 30, 2008  (DE) .................. 10 2008 030 308

(51) Int. Cl.
| | |
|---|---|
| F25D 23/12 | (2006.01) |
| F24F 11/00 | (2006.01) |
| E04H 5/02 | (2006.01) |
| H05K 7/20 | (2006.01) |
| E04H 5/00 | (2006.01) |

(52) U.S. Cl.
CPC ............ *F24F 11/0001* (2013.01); *E04H 5/02* (2013.01); *H05K 7/2079* (2013.01); *E04H 2005/005* (2013.01)

(58) Field of Classification Search
CPC ... E04H 5/02; F24F 11/0001; H05K 7/2079; F25B 31/006; F28D 15/00
USPC ........ 62/259.1, 259.2, 696, 700; 165/104.33, 165/104.19, 47; 361/679.46, 47, 679.47
See application file for complete search history.

(56) References Cited

U.S. PATENT DOCUMENTS

| | | | |
|---|---|---|---|
| 2,075,349 A * | 3/1937 | Lawton ........................... 62/204 |
| 5,323,847 A * | 6/1994 | Koizumi et al. ......... 165/104.33 |
| 6,301,837 B1* | 10/2001 | Ray ................................... 52/27 |
| 7,051,802 B2 | 5/2006 | Baer | |
| 7,315,448 B1* | 1/2008 | Bash et al. ..................... 361/701 |
| 7,367,384 B2* | 5/2008 | Madara .................. G06F 1/203 165/122 |
| 7,971,446 B2* | 7/2011 | Clidaras et al. ............. 62/259.2 |
| 8,395,896 B2* | 3/2013 | Belady ........................... 361/698 |
| 2001/0042616 A1 | 11/2001 | Baer | |
| 2004/0050231 A1* | 3/2004 | Chu ..................... H05K 7/2079 83/574 |
| 2004/0190229 A1 | 9/2004 | Caci et al. | |
| 2006/0037331 A1* | 2/2006 | Nicolai et al. .................. 62/129 |
| 2006/0289149 A1* | 12/2006 | He ........................... 165/104.33 |
| 2008/0029250 A1* | 2/2008 | Carlson et al. .......... 165/104.33 |
| 2008/0093958 A1* | 4/2008 | Peterson ................ H04Q 1/064 312/223.1 |
| 2008/0236070 A1* | 10/2008 | Serinet ........................... 52/234 |
| 2009/0126385 A1 | 5/2009 | Trepte | |
| 2009/0218078 A1* | 9/2009 | Brunschwiler et al. . 165/104.33 |
| 2009/0229283 A1* | 9/2009 | Marsala .......................... 62/119 |

FOREIGN PATENT DOCUMENTS

| | | |
|---|---|---|
| DE | 102005005588 A1 | 8/2006 |
| WO | WO-02/052107 A2 | 7/2002 |
| WO | WO 02052107 A2 * | 7/2002 |
| WO | WO-03/083631 A1 | 10/2003 |

\* cited by examiner

*Primary Examiner* — Len Tran
*Assistant Examiner* — Ana Vazquez
(74) *Attorney, Agent, or Firm* — Cooley LLP

(57) ABSTRACT

The invention relates to a structure of a multi-storey computer center building, which is suitable for accommodating a multiplicity of racks, each of which has storage space for computer hardware. The building has a first cooling circuit in order to dissipate heat generated by the computer hardware and the first cooling circuit is designed to supply at least some of the racks with a coolant. The first cooling circuit is also designed to remove the heated coolant from at least some of the racks. And, the racks have heat exchanger devices, which are suitable for transferring the generated heat to the coolant.

52 Claims, 2 Drawing Sheets

BUILDING FOR A COMPUTER CENTRE WITH DEVICES FOR EFFICIENT COOLING

PRIORITY

Priority is claimed as a national stage application, under 35 U.S.C. §371, to PCT/EP2009/004704, filed Jun. 30, 2009, which claims priority to German application 102008030308.9, filed Jun. 30, 2008. The disclosures of the aforementioned priority applications are incorporated herein by reference in their entirety.

The present invention relates to a data centre building structure, which is adapted to house a multiplicity of racks being designed to provide storage space for computer hardware. The data centre building is equipped with cooling means in order to provide dissipation of heat being generated by the computer hardware.

BACKGROUND AND PRIOR ART

In the prior art, there exist various data building structures for housing a multiplicity of racks, each of which comprising storage space for computer hardware. For instance, a conventional data centre building according to the prior art is sketched in FIG. 1. It comprises a false floor for a computer infrastructure, which is typically housed in 19" rack enclosures. The cooling is accomplished by cold air, which is pumped into the false floors having holes at the appropriate locations in front of the racks. In this way cold air is supplied at the air intakes of the computer racks.

Figure 1:
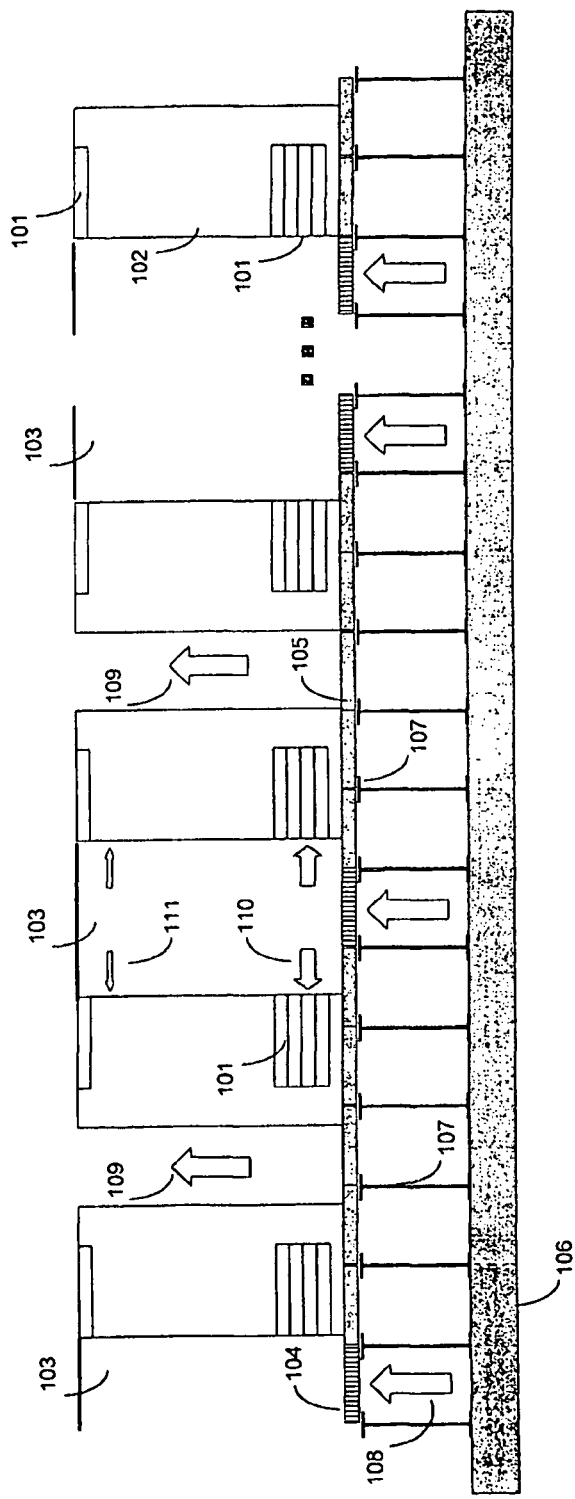

Referring to FIG. 1, the floor 106 carries the false floor, assembled from vertical steel bars 107, carrying the floor tiles 104, 105, which in turn carry the computer infrastructure, for instance 19" racks 102. These racks 102 typically host 19" rack mounted computer infrastructure 101, which is horizontally mounted and acquires air at the front-side of the rack and produces warm air at the back side. In order to cool the computers, the false floor tiles have appropriate air holes 104, such that cold air 110 can be ingested into the racks 102.

In the prior art also an encapsulated cold air aisle 103 is provided in order to avoid, that hot air 109 short circuits the flow of cold air. By means of such an encapsulation, the provided cold air 110, 111 may only leave the aisle 103 via the computers' air intake and correspondingly there is no other way for the heated air to enter this space.

This design is somehow disadvantageous, because the single racks 102 have to be designed as closed racks. Further, the air flow through respective racks 102 has to be surveyed and controlled in order to avoid pumping unnecessary amounts of cold air from the cold aisle. There exist various concepts, providing a regulation of the air flow into the cold isle 103, such that the fans providing the air flow 108 operate at the lowest possible power. The hot air 109 generated at the back of the rack 102 is fed back to not explicitly illustrated heat exchangers being located somewhere else in the data centre building. The heated air is either cooled down again or fresh air is used in order to provide a stream of cold air 108.

This architecture has various disadvantages. First of all, the comparably small heat capacity of air requires rather high temperature differences between the cold air and the heated air. Further, a high air flow rate with corresponding large losses due to air pumping is also required. Reasonable limits of the air flow rate and the air temperature limit the overall size of the data centre building. Further, an air cooling system typically requires 40% of cooling overheat. Moreover, the false floor architecture is quite expensive and wastes volume inside the building.

Document WO 02/052107 A2 further discloses a data centre building comprising a ground floor and spaced lower and upper mezzanine floors between the ground floor and a roof. Each of the mezzanine floors has an open decking for allowing the passage of ambient air, whereby a forced circulation of ambient air is suggested in order to maintain the data centre at acceptable operating temperatures. Even though this described building avoids the use of false or raised flooring by making use of industrial or warehouse space with mezzanine floor constructions, the heat dissipation mechanism is still not optimal, because a vast amount of cooling air has to be forced through the entire building structure, which is difficult to control and which is rather inefficient.

Also here, the overall building size is limited, because for an efficient cooling, the entire inner volume of the building has to be sufficiently supplied with ambient air flow. Further, this architecture does not support multiple floors with large heating sources like computing racks, because the air temperature would rise more and more towards the upper floors. The referred prior art only supports one floor with rather low power density, for instance implementing network equipment and one floor with computer infrastructure.

SCOPE

This invention is to provide a data centre and/or a data centre building structure comprising more efficient and universal cooling mechanisms for computer hardware racks, thus, avoiding the necessity of guiding the cooling air across all racks. Further, the invention aims at optimising energy requirements and costs plus at arranging the computer racks more densely in order to minimize the required length of the network cables and to improve the system's communication capabilities. Compared to usual solutions, this invention is to provide a structure of a data centre building comprising larger, scalable storage capacities and an increased storage volume.

DESCRIPTION

Pursuant to a first aspect, the present invention describes the structure of a data centre and/or data centre building comprising at least a first and second floor and/or a first and/or second storey and which is suitable for housing a large number of racks each of which providing space for computer hardware.

The storeys and/or floors are designed as a high rack warehouse. Therefore, they and/or the entire data centre building do not necessarily have a floor; design and structure may be floor-free. The usage of this high rack warehouse is particularly space-saving since it is possible to do without floors and, in particular, without double floors. Based on this method, the costs for a data centre building designed according to the invention may be reduced since high rack warehouses are cheaper than normal data centre building structures.

Additionally, the data centre building comprises a first cooling circuit to discharge the heat generated by the computer hardware. This first cooling circuit is designed to provide some of the racks with a coolant, and the first cooling circuit is designed to remove the coolant heated by the computer hardware of at least some racks.

The invention is particularly characterized in that the aforementioned racks, which are connected with the first cooling circuit, comprise heat exchangers capable of transferring the entire heat generated by the computer hardware to the coolant. According to the invention, the heat exchangers' dimensions ensure they are capable of removing the entire heat volume generated by the computer hardware. Therewith, it is ensured that no hot air is released to the data centre. The air fed to the racks and the air coming from the racks have the same or even a lower temperature so that it is possible to entirely avoid external, cross-rack air flows. Therefore, it is prevented that the room temperature increases in vertical direction.

In particular, the heat exchangers may be oversized so that the heat exchangers themselves contribute to cooling the data centre.

Therefore, the present invention is based on a complete rack-specific cooling system within the high rack warehouse and a transport mechanism in order to avoid the problem of how to provide and control a flow of cooling air through the entire building. Instead, the first cooling circuit requires little installation room only. Some or even all computer hardware racks are individually connected to the first cooling circuit, which provides an efficient instrument for removing and discharging the heat from the computer hardware.

Coupling each rack to be cooled to the cooling circuit individually with the cooling circuit in connection with the rack-specific heat exchangers suitable to remove the entire heat generated by the computer hardware provides the additional advantage that it is possible to control and monitor the cooling power and heat exchange individually and separately for each individual rack within the structure of the data centre. Cooling the hot air exclusively within the rack makes it possible to install any rack package densities without requiring air flow.

Based on this individual and separate cooling infrastructure it is possible to arrange the racks within a high rack warehouse/multi-storey structure since the entire environmental temperature of the building can be maintained in a well defined, and rather low temperature range. Beyond that, the cooling system proposed allows using a so-called open rack architecture ensuring the racks do not need to be hermetically sealed anymore.

According to a first preferred embodiment of the invention, the first cooling circuit comprises a piping system to remove the coolant. Usage of a liquid coolant such as water and other suitable cooling fluids, particularly with larger thermal capacities than air, is advantageous due to numerous reasons. At first, the total heat quantity that may be transferred and transported is, compared to gaseous coolants, larger. Secondly, it is possible to control and monitor the flow and the transmission of the coolant more easily, compared to a turbulent and laminar flow of a gaseous coolant.

Beyond that, it is recommended that the coolant is conveyed within the cooling circuit, which may contain water or any other liquid having a comparably high thermal capacity, with a pressure lower than atmospheric pressure. Based on this, it is guaranteed that not every leakage in the piping system causes immediately loss of coolant escaping from the piping system. Instead, the environmental air would enter into the piping system and, based on this, prevent that sensitive and expensive computer hardware would be damaged by this coolant.

The storeys and/or floors of the high rack warehouse do, according to another preferred embodiment, not have a false floor. Based on this, installation space is saved and package density of the computer hardware may be increased.

Further, it is possible to reduce the difference in temperature between the coolant supply and the computer hardware rack which is to be cooled to a minimum using an efficient insulation means within the piping system, whereby it is simultaneously possible to remove the heated coolant from the building or feed it to a heat or cooling reservoir without heating the building itself unintentionally.

The heat exchanging means being arranged inside or in direct vicinity of a computer hardware rack are adapted to transfer the entire heat generated inside the rack to the coolant. Therefore, the heat exchanging means of each rack to be cooled provide a heat coupling between the provided coolant and the inner volume of the rack.

By means of the liquid coolant supplying piping, the entire building structure can be designed in a universal and flexible way. Hence, in contrast to prior art solutions, various floors of the building do no longer have to be permeable for ambient air flow. Also, there is no longer a need to provide encapsulated cold airs aisles and additionally, it is no longer required to control a difficult-to-handle global flow of cooling air inside a data centre building.

According to a further preferred embodiment, the data centre building structure comprises at least a first and a second storey, which is supported by a steel support structure. Additionally, three or even more storeys arranged on top of each other are conceivable and are in the scope of the present invention. In particular, the steel support structure may be designed as a high rack warehouse, wherein the steel support structure directly serves as a support for the computer hardware racks. Therefore, floors segments or floor tiles to be arranged between the various computer racks and the steel support structure are no longer required.

According to a further preferred embodiment, the racks are directly arranged on double-T beams of the steel support structure. Further, mesh grids or comparable support structures can be arranged in the clearance of adjacently located racks. Here, the mesh grids may serve as a kind of floor segment. Due to their mesh-like design, they allow penetration of a directed air flow. Additionally, depending on the mesh size, those mesh grids can also be optimized with respect to weight.

According to a further preferred embodiment, at least some of the racks comprising a heat exchanging unit are adapted to transfer heat between the coolant, which is provided by the piping, and a gaseous heat exchanging medium. Here, it is intended, that the gaseous heat exchanging medium is in thermal contact with the computer hardware components disposed inside the rack. The heated gaseous heat exchanging medium is further in thermal contact with the heat exchanging unit and serves to transfer the accumulated heat to the liquid coolant inside the piping.

In this way, the flow of a gaseous cooling medium can be reduced to a confined space, in particular inside the respective rack. Hence, the heat exchanging means in combination with the liquid coolant are adapted to provide a very effective means to prevent any hot air flow outside the racks. Hot air cannot escape from the inside of the rack to the outside.

Furthermore, the heat exchanging means may directly receive the hot air generated by the computer hardware inside the rack and may transform this hot air back down to a desired room temperature by simply conveying the heat to the coolant conveying piping. In this way, any routing of hot air inside the data centre building can be avoided.

Also, the distance over which hot or heated air travels can be reduced to a minimum. It is only required to transport the heated air inside the rack, in particular from the computer hardware to the heat exchanging means. In this way, any difficult-to-control turbulent air flow can be prevented.

Instead, the invention comes along with a smooth and laminar air flow, which is basically constricted inside the rack.

Even though, a heat exchange between a liquid coolant and a gaseous heat exchanging medium is an easy and straight forward approach on how to provide efficient and effective cooling, it is also in the scope of the present invention, that the heat exchanging medium used inside the rack is also liquid instead of gaseous. Hence, each rack may comprise heat exchanging means having appropriate flanges in order to couple the rack-internal cooling architecture to the first cooling circuit, which is adapted to interconnect various racks among each other and to convey the generated heat to an external reservoir.

Another advantage of the rack-based heat exchanging means is, that the racks themselves do not have to be kept closed and that the air flow into and out of the racks does no longer have to be controlled. As a further benefit, inside the data centre building, there are no additional air conditioners required, as the cooling function may be completely taken over by the heat exchanging units inside the racks.

In particular, since the heat exchanging means comprise a rather large surface, a relatively low and laminar stream of air can be obtained inside the particular rack, thus allowing to reduce the speed of optional fans and to minimize a corresponding fan power consumption of the cooling.

According to a further preferred embodiment, at least some of the racks comprise at least one cooling fan. Preferably, any of those racks having heat exchanging mean comprise at least one fan, which is either directly coupled to the heat exchanging means or which is disposed in close vicinity to the heat exchanging means in order to provide a sufficient cold air circulation inside the particular rack.

According to another embodiment of the invention, those heat exchanging means comprising at least one fan and a heat exchanger, are pair-wise and adjacently arranged. In this way, the invention provides a redundancy in case, that one of a pair of heat exchanging means may become subject to malfunction. In such a case, the heat exchanging means of an adjacently located rack may take over the function of that heat exchanging means, which is subject to failure. Further, the fan speed of the intact heat exchanging means can be individually increased in order to compensate for the system failure of the neighbouring heat exchanger or its fan.

Therefore, it is of advance, that at least some of the racks comprise control means for individually regulating the heat exchanging means. In this way, the entire system a may adaptively, locally react on local system failures and may automatically initiate respective provisions in order to compensate the failure.

According to another embodiment, the control means further comprise leak detectors for the piping and/or the smoke detectors, whereby said detectors are coupled to an emergency system, which is adapted to selectively switch off the hardware and/or the relevant branch of the cooling unit.

The emergency system may be designed and arranged in any of said racks individually and separated from an emergency system of neighbouring or adjacent racks. Smoke and leakage detectors may be installed separately and independently from each other in order to individually switch off burning or stewing computer hardware and to be able to maintain all other operations of the data centre. Alternatively, it may also be imaginable to use a combination of individual detectors and/or to use a multi-functional detector.

According to a further embodiment, the racks further comprise power scheduling means, that are adapted to keep an overall rush-in electric current below a predefined threshold. This embodiment is adapted to prevent, that the entire data centre draws an amount of energy which cannot be provided by an external power supply. Therefore, the power scheduling means are adapted to regulate, that each rack or a pair of racks draws power from an electric current- or voltage supply according to a given time sheet.

For instance, a first rack may power-up after a given time-delay compared to any other rack of the data centre. In this way, peak-power consumption of the entire data centre building can be kept below a predefined threshold, thus ensuring, that the external power supply does not brake down. The power scheduling means may either be implemented as a specific algorithm assigning a predefined individual, hence different, time-delay to any of the racks of the data centre building.

Alternatively, it is also conceivable, that a power switch-on of the various racks is controlled by means of a centralised architecture. However, also an interconnected emergency system is in the scope of the present invention, whereby a multiplicity of leak- and/or smoke detectors are electrically coupled to a central emergency system, which may automatically initiate respective provisions in order to counteract a system failure.

According to another preferred embodiment, the data centre further comprises a second cooling circuit comprising the same principal structure than the first cooling circuit. However, first and second cooling circuits are alternately arranged in each storey of the data centre building. In particular, if the racks in each storey are disposed in a row- or column-wise arrangement, every second column or row of racks, for instance even numbered rows of racks are typically coupled to the first cooling circuit whereas odd numbered columns or rows are coupled to the second cooling circuit. In this way, even in case that the first or second cooling circuit may become subject to a malfunction, the remaining intact cooling circuit may overtake the entire cooling of all racks of the relevant storey.

The compact architecture of the preferred embodiment allows to operate the data center at relatively high ambient temperatures, therefore also rising the temperature of the coolant liquid. Higher temperatures of coolant liquid allow more efficient cooling. In case the coolant temperature approaching 30° C., the heat accumulated from the computer hardware may be used in order to heat other parts of a building, in particular in wintertime without a necessity to make use of heat pumps.

According to another aspect, the first and/or second cooling circuit are directly coupled to heating means of a separate building or building unit being located in close vicinity of the data centre building structure. By making use of a heated coolant temperature of around 30° C., surrounding buildings or building units can be directly heated by means of the heated coolant without the necessity of making use of additional devices, such as e.g. heat pumps. In particular, the cooling circuit can be directly coupled to radiators or comparable heating means of a building or building unit.

Furthermore, the first and/or second cooling circuit is adapted to be coupled to an external heat reservoir. This heat reservoir can be used as energy buffer, for instance storing the heat accumulated from the computer hardware in winter during the night in order to provide more building heating power during the day. In summer the heat reservoir can be used for storing heat energy during the day, allowing to cool down at night with higher efficiency due to colder ambient temperature.

According to a further embodiment, the double-T beams of the support structure, e.g. steel support structure may further serve as a guiding and support structure for a lifting device, being adapted transport and to lift entire racks of a storey across the storey plane. In this way, configuration and reconfiguration of the entire data centre building can be facilitated without the necessity to provide any floor structure for transporting of the computer hardware racks.

In another and independent aspect, the invention refers to a computer hardware rack which may be installed within a high rack warehouse in the above mentioned data centre building. The computer hardware rack contains storage room for computer hardware and at least one heat exchanger unit that can be connected to a cooling circuit conveying cooling liquid. Beyond that, the computer hardware rack comprises control systems that are designed to control the heat exchangers of the rack individually and/or autonomously.

The heat exchanger is dimensioned in a way so that the entire heat volume generated by the computer hardware is removed so that the heat is not transferred to the environment of the rack.

In still another aspect, the invention provides a method for cooling of a data centre building structure that comprises a multiplicity of computer hardware racks, each of which comprising storage space for computer hardware. The method provides an approach to dissipate heat being generated by the computer hardware by the steps of conveying a coolant to at least some of the racks by means of a first cooling circuit and by transferring the heat to the coolant by means of heat exchanging means and by finally conveying the heated coolant away from the racks to a cooling system by making use of heat exchanging means arranged at each rack to be cooled. In this way an individual and separate rack-wise cooling of a data centre building can be provided. Also, the cooling can be adapted to the cooling requirements of each rack individually.

Furthermore, the method of cooling the data centre building is characterised in that the heat exchanging means are separately and/or autonomously regulated. This separate and autonomous regulation of rack-specific heat exchanging- or cooling means allows to implement a multi-storey building structure with an increased packing or storage density which provides a sufficient heat dissipation, which can even exceed a volumetric heat dissipation rate of 2 kW per m$^3$.

By means of making use of a cooling circuit being adapted to convey a liquid coolant, the variety of the building architecture can be enhanced, since the coolant can be conveyed to any location inside the building structure, where heat is generated by means due to computer hardware.

EMBODIMENT

Figure 2:
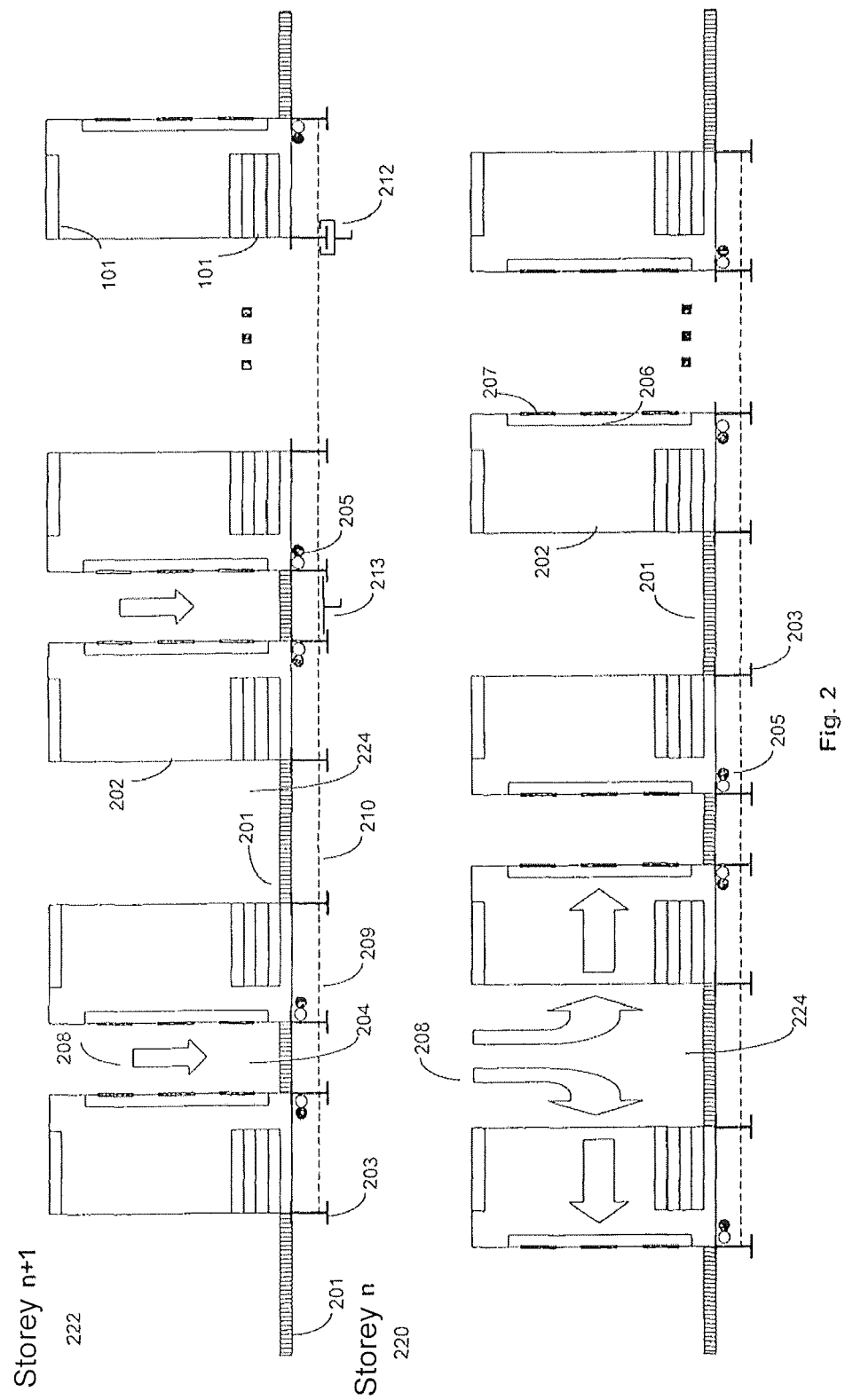

In the following, preferred embodiments of the invention will be described in detail by making reference to the drawings in which:

FIG. 1 schematically illustrates a data centre building according to the prior art and FIG. 2 schematically illustrates a two-storey data centre building structure according to the present invention.

In FIG. 2, two-storeys of the data centre building structure are disclosed. The supporting structure of the computer hardware 101 is designed as a high rack warehouse, which comprises regularly arranged T-beams 203, preferably comprising steel. The horizontal distance of adjacent steel T-beams is adapted to the size and geometry of the racks 202 providing storage space for the computer hardware 101. The high rack warehouse has several floors 220, 222 in which the computer hardware 101 is located in racks 202.

For instance, the distance of pairs of steel T-beams corresponds to the horizontal elongation of the racks 202. In this way, the racks 202 can be directly mounted onto the steel T-beams. However, the distance between pairs of steel T-beams may differ. In the illustration of FIG. 2, a clearance 204 between adjacently disposed racks 202 may differ to a clearance 224. However, although not critically required, the clearances 204, 224 are typically covered with mesh grid elements, allowing for a penetration of cooling air in the vertical direction.

In the illustrated embodiment of FIG. 2, any of the racks 202 comprises a separate heat exchanging unit 206, which is equipped with a heat exchanger and with at least one fan 207 in order to facilitate the cooling air flow inside the rack 202. The heat exchanging units 206 are all coupled to a piping 205 conveying a liquid coolant, e. g. water, to any of the racks 202. Additionally, heat exchanging units 206 and appropriate fans 207 of pair-wise adjacently disposed racks 202 within one row are designed to provide a redundancy in case, that one of the heat exchanging units 206 or appropriate fans 207 becomes subject to malfunction.

In such cases, the heat exchanging unit 206 and the fans 207 of a neighbouring and adjacently arranged rack 202 may take over the cooling function of the dropped out heat exchanging unit.

The coolant supplied by means of a piping 205 is beneficial in that the various racks 202 no longer have to be designed as closed racks. Moreover, heat dissipation outside the various racks 202 can be effectively reduced to a minimum. Hence, it is no longer necessary to control a global air stream inside the building structure. In this way generation of hot spots which might be due to some turbulent hot air flow outside the racks 202 can be effectively eliminated.

Additionally, the airflow throughout the data centre building structure does no longer have to be actively controlled, since the ambient temperature around the racks 202 is kept on a relatively cold level compared to the temperature inside the racks 202.

As shown in FIG. 2, the racks 202 are formed by a plurality of sides including a top side and a back side. The plurality of sides form the storage space housing the computer hardware 101 in the storage space. As also shown in FIG. 2, the heat exchanging units are mounted to the racks 202 spaced from and out of contact with the computer hardware 101.

In order to implement failure tolerance on the cooling infrastructure, the racks 202 can be operated in an even/odd fashion, where every second rack is coupled to the same piping, namely either the first or second cooling circuit. In this way, two redundant cooling circuits can be maintained providing a residual cooling capacity. The air pumping capacity of the heat exchanger fans 207 is preferably over dimensioned, which allows to compensate the loss of one fan by running the other intact fans of the same or neighbouring rack 202 at an appropriate higher speed.

In case of a failure, for instance due to a leak in the piping 205, a particular rack can be selectively decoupled from the piping system 205. Such a decoupled rack 202 may be cooled by using the adjacently disposed neighbouring racks as a kind of substitute cooling means, which may be operated at a higher fan speed. Even if an entire cooling system fails, the second set of racks 202, being coupled to the second cooling circuit, will take over the cooling of the next neighbours equivalently by operating its fans at an appropriate higher or even at maximum speed. In this way, the intact heat exchanging means and their cooling fans may ingest the hot air from their respective neighbours. However, if for instance the cooling capacity may not be sufficient any longer, also the temperature of the coolant may be lowered, thus immediately providing a higher cooling efficiency.

Since there is no requirement to guide any air throughout the data centre building structure, the computer hardware racks 202 can be mounted and disposed in any arbitrary arrangement, in particular by making use of the third dimension. In the embodiment as illustrated in FIG. 2, the racks 202 are mounted side by side and they are typically arranged in rows, facing front to front and back to back for optimal usage of the available space.

Other embodiments are imaginable, whereby the racks are arranged with front side to rear side so that the next row absorbs the air directly from the heat exchangers of the previous row. However, this scenario needs a bit more space since the distances between the rows of the racks 202 must not be smaller than the length of a rack drawer, e.g. a drawer of 19 inch.

The coolant supply for each individual rack 202 is in particularly beneficial, since it allows a multi-storey steel structure for computer hardware racks. In contrast, with conventional air-flow based cooling systems, an upper limit of cooling capacity is rapidly reached, as soon as the data centre building structure has more than 2 storeys. Moreover, the purely air-flow based cooling becomes more and more inefficient with an increasing building size, in particular building with increasing building height.

As further sketched in FIG. 2, the clear height required above the racks can be kept at a rather low limit, for instance, at about 50 cm, leading to storey height of 2.5 m, when racks of 2 m height are implemented. The steel support structure 203 not only carries the racks 202, but also low cost grid floor elements 201, which are adapted to support maintenance work in such a high rise rack storey architecture. As a result, the entire building structure may comprise a steel grid, which can be built at very low costs from standard building blocks. Different row pitches and storey heights can be accumulated and/or adopted if required, simply by moving the standard size T-beams 203. The open floor structure 201 may additionally support air 208 flow between the various storeys.

The steel bars implement standard mounting for the cooling water piping 205 and appropriate cable trays for the cabling 209, 210. Below every rack row a standard longitudinal cable tray 209 is mounted by direct attachment to the TBars as sketched in FIG. 2. Transversal cable trays 210 are inserted, implementing a cable tray grid with an adjustable pitch. They are also attached to the T-bars like the trays 209. The connection to the longitudinal cable trays 209 is provided by appropriate holes in the castellated T-beams.

Vertical cabling is easily afforded between the racks top and/or bottom or by implementing vertical cable trays in spare locations. This architecture makes the ceiling of story n to the false floor of story n+1. The implementation of the computer hardware in multiple storeys results in the shortest average cabling distance for any given system, as this parameter rises only with the third root of the systems' volume. The rather open architecture allows the implementation of the shortest possible cable paths between any two locations and therefore the shortest latencies between the nodes.

The bottom part of the T-bars carrying the racks can be used to support a moveable hook with an attached hoist 212, 213, implementing a low-cost moveable crane, supporting the installation of heavy equipment.

The air flow in the racks can be optimised, implementing a low temperature difference between the hot spots inside the computer and the ambient temperature. Assuming a state of the art temperature difference of less than 20° C. between the ambient air and the hot spots inside the rack 202, an air temperature of 40° C. is conceivable, allowing the heat exchangers to operate at 30° C. with a 10° C. temperature difference for cooling the air.

Rising the ambient temperature in the data centre therefore rises the cooling water temperature, which directly increases the cooling efficiency of the heated cooling water. The low cost floor space in the data centre allows the usage of larger enclosures, such as 3U 19" systems or blade systems, using large fans and moving larger amounts of air at lower speed. The fans 207 may assist this air flow, supporting to reduce the fan speed inside the computers further.

The fan speed in the heat exchanger is optimised according to the needs of the specific equipment in the rack. On one hand the consumed power is measured by detecting the primary currents into the computer, defining the dissipated heat. The measured ambient air temperature and the heat exchanger's temperature define the required air flow for cooling and therefore the fan speed.

On the other hand the ambient temperature at the top and rear side of the rack is measured. In case of insufficient air flow through the heat exchanger, this temperature will increase due to hot air leaving the rack. Therefore, the performance of the cooling system is verified independently in every rack.

In operation mode, all air leaving the computers of a rack flows through the appropriate heat exchanger. Therefore, it is possible to detect overheating inside the rack by detecting smoke in the airflow. In case of such a failure, the primary power to the computers in the rack can be cut after attempting an emergency shutdown of the machines in the rack. Normal computers do not present a significant fire load and therefore the disconnecting of the primary power will stop critical rise or escalation of the problem. Having control over the primary power in a rack allows to schedule the power-on event, in order to limit the rush-in currents. In the preferred embodiment of the invention the individual racks negotiate a schedule for the powering-up of the computers.

An operating temperature of 30° C. allows the direct use of the cooling water to heat nearby located office buildings, provided they implement floor and wall heating. In summer, the data centre's heat can be used to cool buildings, using convection coolers.

The energy of the cooling water can be stored at night in a latent heat reservoir, where the office buildings require much less heating. During the day the equivalent larger amount of heat is available for heating, matching the constant walk heat generation in the data centre with the duty cycle of the office building.

Another utility of the latent heat store is used in summer during peak temperatures. During this time not all heat may be useable and may have to be conveyed away. Since the cooling efficiency drops with increasing outside temperature, the heat reservoir is used here during the day to store the heat and to dissipate the amount of heat during night time, when the outside temperature is significantly lower.

REFERENCE LIST OF REFERENCE NUMERAL 101 computer hardware
102 rack
103 cold aisle
104 open floor tyle
105 closed floor tyle
106 ground floor
107 false floor T-beam
108 cold air flow
110 air flow
111 air flow
112 false floor
201 grid floor
203 steel T-beam
204 clearance
205 piping system
206 heat exchanging unit
207 fan
208 air flow
209 longitudinal cable tray
210 lateral cable tray
212 crane
213 crane
220 storey n 222 storey n+1
224 clearance

The invention claimed is:

1. A multi-storey data centre comprising:
at least a first storey and a second storey above the first storey,
a multiplicity of open computer hardware storage racks that are not hermetically sealed, the open computer hardware storage racks situated in both the first storey and the second storey of the multi-storey data centre, each rack of the multiplicity of open computer hardware storage racks comprising:
a plurality of individual computer hardware each horizontally rack mounted in a front side of the rack; and
a heat exchanging unit vertically mounted to a back side of the rack; and
a first cooling circuit, interconnecting in parallel heat exchanging units of at least some of the multiplicity of open computer hardware storage racks, the first cooling circuit configured to dissipate heat generated by first computer hardware in the at least some of the multiplicity of open computer hardware storage racks, supply the heat exchanging units of the at least some of the multiplicity of open computer hardware storage racks with a coolant, and convey the coolant heated by the first computer hardware away from the at least some of the multiplicity of open computer hardware storage racks,
wherein the multiplicity of open computer hardware storage racks situated in both the first storey and the second storey are arranged such that at least a first rack and a second rack of the multiplicity of open computer hardware storage racks are back to back with a first heat exchanger unit of the first rack facing a second heat exchanger unit of the second rack.

2. The data centre according to claim 1, wherein the coolant is transported within the first cooling circuit with a pressure lower than atmospheric pressure.

3. The data centre according to claim 2, wherein the first cooling circuit is designed as a vacuum system.

4. The data centre according to claim 1, wherein at least the first storey and the second storey do not have false floors.

5. The data centre according to claim 1, wherein the second storey is supported by a supporting structure.

6. The data centre according to claim 1, wherein the multiplicity of open computer hardware storage racks are directly arranged at double T-beams of a supporting structure and wherein grid floors are arranged within spacing between adjacent racks in the multiplicity of open computer hardware storage racks.

7. The data centre according to claim 6, wherein the double T-beams are used as guiding and supporting structure for a lifting device, and the supporting structure is a steel beam structure.

8. The data centre according to claim 1, wherein the multiplicity of open computer hardware storage racks are situated in both the first storey and the second storey such that the heat exchanging units of multiple pairs of adjacent racks of the multiplicity of racks are facing each other.

9. The data centre according to claim 1, wherein the multiplicity of open computer hardware storage racks is provided with control systems to individually control the heat exchanging units.

10. The data centre according to claim 9, wherein the control systems comprise a leakage detector for a piping system, wherein said leakage detector is coupled to an emergency system configured to selectively switch off the first computer hardware and/or the first cooling circuit, and wherein the control systems are configured to switch off the first computer hardware for each rack individually.

11. The data centre according to claim 9, wherein the control systems comprise a smoke detector, wherein said smoke detector is coupled to an emergency system configured to selectively switch off the first computer hardware and/or the first cooling circuit.

12. The data centre according to claim 1, wherein the multiplicity of open computer hardware storage racks further comprises a system for switching on electricity suitable to maintain an electrical starting current below a predefined limit.

13. The data centre according to claim 1, further comprising a second cooling circuit, the second cooling circuit having a same structure as the first cooling circuit, wherein the sections of piping systems of the first and second cooling circuits are alternately arranged in each row of racks.

14. The data centre according to claim 1, wherein the first cooling circuit is coupled to an external heat reservoir.

15. The data centre according to claim 1, wherein the first cooling circuit is coupled directly with a heating system of a separate building or building system, wherein the heating system is configured to heat the building or building system.

16. The data centre according to claim 15, wherein the heating system is configured to heat the building or building system to 17° C. or higher.

17. The data centre according to claim 1, wherein each rack includes only one heat exchanging unit.

18. The data centre according to claim 1, wherein the racks are 19 inch racks.

19. The data centre according to claim 1 wherein the heat exchanging units mounted to the racks are the only heat removal system for removing, by a horizontal air flow, heat generated by the plurality of computer hardware mounted in the racks.

20. The data centre according to claim 1 wherein air enters the racks from the front side of the racks.

21. The data centre according to claim 1 wherein the plurality of individual computer hardware is arranged in a vertical stack in each rack, and the heat exchanging unit of each rack is located outside of the vertical stack.

22. The data centre of claim 21, wherein:
the multiplicity of open computer hardware storage racks are arranged in three dimensions in the data centre;
in each of the first storey and the second storey of the data centre, respective groups of the multiplicity of racks are arranged in rows and mounted side by side, facing front to front and back to back.

23. The date centre of claim 1, wherein the data centre is a high rack warehouse comprising at least a third storey, and wherein at least some of the multiplicity of open computer hardware storage racks are situated in the third storey.

24. The data centre of claim 1, wherein the heat exchanging unit of each open computer hardware storage rack has dimensions that ensure removal of substantially all of the heat generated by the plurality of individual computer hardware mounted in the rack.

25. The data centre of claim 24, wherein the data centre does not include an air conditioner.

26. The data centre of claim 24, wherein:
a first air temperature in the first rack of the multiplicity of open computer hardware storage racks, arising from the heat generated by the plurality of individual computer hardware mounted in the first rack, is up to 40 degrees Celsius; and
the first heat exchanger unit for the first rack operates at an operating temperature that effectively absorbs essentially all of the heat generated by the plurality of individual computer hardware mounted in the first rack.

27. The data centre of claim 26, wherein a coolant temperature of the coolant is approximately 30 degrees Celsius.

28. The data centre of claim 1, wherein each heat exchanging unit operates at approximately 30 degrees Celsius.

29. The data centre of claim 1, wherein a coolant temperature of the coolant approaches 30 degrees Celsius.

30. The data centre of claim 1, further comprising a second cooling circuit, wherein the first cooling circuit interconnects first heat exchanging units of a first number of the multiplicity of racks, and the second cooling circuit interconnects second heat exchanging units of a second number of the multiplicity of racks.

31. The data centre of claim 30, wherein the first cooling circuit and the second cooling circuit are alternately arranged in the first storey and the second storey of the data centre.

32. The data centre according to claim 1, wherein:
the multiplicity of racks in at least the first storey are arranged in multiple rows of racks;
the first cooling circuit interconnects first heat exchanging units of racks in even numbered rows of the multiple rows of racks; and
the data centre further comprises a second cooling circuit that interconnects second heat exchanging units of racks in odd numbered rows of the multiple rows of racks.

33. The data centre of claim 1, further comprising a second cooling circuit, wherein:
the multiplicity of open computer hardware storage racks are arranged in rows and columns in the data centre;
the first cooling circuit interconnects a first plurality of heat exchanging units of even rows or even columns; and
the second cooling circuit interconnects a second plurality of heat exchanging units of odd rows or odd columns.

34. The data centre of claim 33, wherein the first cooling circuit and the second cooling circuit are alternately arranged in the first storey and the second storey of the data centre.

35. The data centre of claim 1, wherein:
the data centre is a high rack warehouse comprising at least a third storey;
at least some of the multiplicity of open computer hardware storage racks are situated in the third storey;
the data centre further comprises a second cooling circuit, wherein the first cooling circuit interconnects first heat exchanging units of a first number of the multiplicity of racks, and the second cooling circuit interconnects second heat exchanging units of a second number of the multiplicity of racks;
the data centre includes a steel support structure; and
the multiplicity of racks are arranged in the first storey, the second storey and the third storey so as to be directly supported by the steel support structure of the data centre.

36. The data centre of claim 35, wherein:
the steel support structure of the data centre comprises a plurality of double-T beams; and
the multiplicity of racks are directly mounted onto corresponding ones of the plurality of double T-beams.

37. A method for cooling a high rack warehouse data centre building structure comprising a multiplicity of open computer hardware storage racks that are not hermetically sealed, each rack comprising a plurality of individual heat generating computer hardware, each individual heat generating computer hardware being horizontally rack mounted in a front side of the rack, the method comprising:
conveying a coolant to at least some of the multiplicity of open computer hardware storage racks by a first cooling circuit;
transferring heat generated by first computer hardware in the at least some of the multiplicity of open computer hardware storage racks to the coolant with heat exchanging units vertically mounted to back sides of respective ones of the at least some of the multiplicity of open computer hardware storage racks; and
conveying a heated coolant away from the at least some of the multiplicity of open computer hardware storage racks,
wherein:
the heat exchanging units of the at least some of the multiplicity of open computer hardware storage racks are interconnected in parallel to the first cooling circuit; and
the multiplicity of open computer hardware storage racks are arranged such that at least a first rack and a second rack of the multiplicity of open computer hardware storage racks are back to back with a first heat exchanger unit of the first rack facing a second heat exchanger unit of the second rack.

38. The method of claim 37, wherein:
the high rack warehouse data centre comprises a first storey and a second storey above the first storey;
the multiplicity of open computer hardware storage racks are arranged in three dimensions in the high rack warehouse data centre; and
in each of the first storey and the second storey of the data centre, respective groups of the multiplicity of racks are arranged in rows and mounted side by side, facing front to front and back to back.

39. The method of claim 38, wherein the high rack warehouse data centre comprises at least a third storey, and wherein at least some of the multiplicity of open computer hardware storage racks are situated in the third storey.

40. The method of claim 37, wherein the heat exchanging units have dimensions that ensure removal of substantially all of the heat generated by the first computer hardware mounted in the at least some of the multiplicity of open computer hardware storage racks.

41. The method claim 40, wherein the data centre does not include an air conditioner.

42. The method of claim 37, wherein:
a first air temperature in the first rack of the multiplicity of open computer hardware storage racks, arising from the heat generated by the plurality of individual computer hardware mounted in the first rack, is up to 40 degrees Celsius; and
the first heat exchanger unit for the first rack operates at an operating temperature that effectively absorbs essentially all of the heat generated by the plurality of individual computer hardware mounted in the first rack.

43. The method claim 42, wherein a coolant temperature of the coolant is approximately 30 degrees Celsius.

44. The method claim 37, wherein each heat exchanging unit operates at approximately 30 degrees Celsius.

45. The method of claim 37, wherein a coolant temperature of the coolant approaches 30 degrees Celsius.

46. The method of claim 37, further comprising
conveying a second coolant to the at least some of the multiplicity of open computer hardware storage racks by a second cooling circuit,
wherein the first cooling circuit interconnects first heat exchanging units of a first number of the multiplicity of racks, and the second cooling circuit interconnects second heat exchanging units of a second number of the multiplicity of racks.

47. The method of claim 46, wherein
the high rack warehouse data centre comprises a first storey and a second storey above the first storey; and
the first cooling circuit and the second cooling circuit are alternately arranged in the first storey and the second storey of the data centre.

48. The method of claim 37, wherein:
the high rack warehouse data centre comprises a first storey and a second storey above the first storey;
the multiplicity of open computer hardware storage racks in at least the first storey are arranged in multiple rows of racks;
the first cooling circuit interconnects first heat exchanging units of racks in even numbered rows of the multiple rows of racks; and
the data centre further comprises a second cooling circuit that interconnects second heat exchanging units of racks in odd numbered rows of the multiple rows of racks.

49. The method of claim 37, further comprising:
conveying a second coolant to the at least some of the multiplicity of open computer hardware storage racks by a second cooling circuit,
wherein:
the multiplicity of open computer hardware storage racks are arranged in rows and columns in the data centre;
the first cooling circuit interconnects a first plurality of heat exchanging units of even rows or even columns; and
the second cooling circuit interconnects a second plurality of heat exchanging units of odd rows or odd columns.

50. The method of claim 49, wherein:
the high rack warehouse data centre comprises a first storey and a second storey above the first storey; and
the first cooling circuit and the second cooling circuit are alternately arranged in the first storey and the second storey of the data centre.

51. The method of claim 37, wherein:
the high rack warehouse data centre comprises a first storey, a second storey above the first storey, and a third storey above the second storey;
at least some of the multiplicity of open computer hardware storage racks are situated in the third storey;
the data centre further comprises a second cooling circuit, wherein the first cooling circuit interconnects first heat exchanging units of a first number of the multiplicity of racks, and the second cooling circuit interconnects second heat exchanging units of a second number of the multiplicity of racks;
the data centre includes a steel support structure; and
the multiplicity of racks are arranged in the first storey, the second storey and the third storey so as to be directly supported by the steel support structure of the data centre.

52. The method claim 51, wherein:
the steel support structure of the data centre comprises a plurality of double-T beams; and
the multiplicity of racks are directly mounted onto corresponding ones of the plurality of double T-beams.

* * * * *